(12) United States Patent
Ito et al.

(10) Patent No.: US 11,982,368 B2
(45) Date of Patent: May 14, 2024

(54) PIEZOELECTRIC ACTUATOR, PIEZOELECTRIC VALVE, AND METHOD OF MANUFACTURING PIEZOELECTRIC ACTUATOR

(71) Applicants: SATAKE CORPORATION, Tokyo (JP); MECHANO TRANSFORMER CORPORATION, Tokyo (JP)

(72) Inventors: Takafumi Ito, Tokyo (JP); Tadashi Matsushita, Tokyo (JP); Toshiro Higuchi, Tokyo (JP); Sze Keat Chee, Tokyo (JP); Kunio Ebihara, Shimotsuma (JP); Toshitada Hirata, Shimotsuma (JP)

(73) Assignees: SATAKE CORPORATION, Tokyo (JP); MECHANO TRANSFORMER CORPORATION, Tokyo (JP)

( * ) Notice: Subject to any disclaimer, the term of this patent is extended or adjusted under 35 U.S.C. 154(b) by 251 days.

(21) Appl. No.: 17/615,653

(22) PCT Filed: Mar. 6, 2020

(86) PCT No.: PCT/JP2020/009798
§ 371 (c)(1),
(2) Date: Dec. 1, 2021

(87) PCT Pub. No.: WO2020/246090
PCT Pub. Date: Dec. 10, 2020

(65) Prior Publication Data
US 2022/0316617 A1 Oct. 6, 2022

(30) Foreign Application Priority Data
Jun. 5, 2019 (JP) .................. 2019-105449

(51) Int. Cl.
*F16K 31/00* (2006.01)
*H02N 2/04* (2006.01)
*H10N 30/20* (2023.01)

(52) U.S. Cl.
CPC .......... *F16K 31/007* (2013.01); *F16K 31/003* (2013.01); *F16K 31/004* (2013.01); *H02N 2/043* (2013.01); *H10N 30/20* (2023.02)

(58) Field of Classification Search
CPC .... F16K 31/003; F16K 31/007; F16K 31/004; H10N 30/20; H10N 30/50; H10N 30/883; H02N 2/043
(Continued)

(56) References Cited

U.S. PATENT DOCUMENTS 4,051,396 A * 9/1977 Berlincourt ............ H02N 2/183
310/339
4,662,212 A * 5/1987 Noguchi .............. G01N 29/024
73/24.01
(Continued)

FOREIGN PATENT DOCUMENTS

JP H03-172688 A 7/1991
JP H09-329252 A 12/1997
(Continued)

OTHER PUBLICATIONS

Extended European Search Report dated Aug. 4, 2023 in Application No. 20819535-4.

*Primary Examiner* — William M McCalister
(74) *Attorney, Agent, or Firm* — Faegre Drinker Biddle & Reath LLP

(57) ABSTRACT

Provided is a piezoelectric actuator that can reduce a risk of air leakage due to weakening of pressing force of a valve element against a valve seat surface and airtightness. The piezoelectric actuator is used for a piezoelectric valve that opens and closes a valve utilizing displacement of a lami-
(Continued)

nated piezoelectric element. The piezoelectric actuator includes: a valve element; a laminated piezoelectric element that generates a driving force, required for operation of the valve element, as a displacement; and a displacement enlargement mechanism that enlarges a displacement of a laminated piezoelectric element and causes the enlarged displacement to act on the valve element. In the piezoelectric actuator, a surface of the valve element to be in contact with a valve seat of the piezoelectric valve is made flat and smooth in a state in which a tensile load is applied to the laminated piezoelectric element.

10 Claims, 5 Drawing Sheets

(58) Field of Classification Search
USPC .................................................. 251/129.06
See application file for complete search history.

(56) References Cited

U.S. PATENT DOCUMENTS

| | | | |
|---|---|---|---|
| 5,224,510 A | 7/1993 | Pericles | |
| 5,253,010 A * | 10/1993 | Oku | H01L 23/4985 |
| | | | 257/E23.125 |
| 5,331,241 A * | 7/1994 | Itoh | H10N 30/073 |
| | | | 310/348 |
| 5,589,723 A * | 12/1996 | Yoshida | H02N 2/025 |
| | | | 310/323.02 |
| 5,747,672 A * | 5/1998 | Parent | G10K 11/004 |
| | | | 73/61.79 |
| 5,786,654 A * | 7/1998 | Yoshida | H02N 2/067 |
| | | | 310/323.17 |
| 5,920,145 A * | 7/1999 | Wu | H10N 30/88 |
| | | | 310/365 |
| 6,003,836 A | 12/1999 | Cewers | |
| 6,040,643 A * | 3/2000 | Bruns | H02K 99/20 |
| | | | 310/12.01 |
| 6,211,602 B1 * | 4/2001 | Yoshida | H02N 2/025 |
| | | | 310/323.01 |
| 6,919,666 B2 * | 7/2005 | Bartzke | H02N 2/025 |
| | | | 310/323.01 |
| 7,078,846 B2 * | 7/2006 | Tsukui | G01P 1/08 |
| | | | 310/317 |
| 10,125,735 B2 * | 11/2018 | Mutlu | F02M 3/0077 |
| 10,161,560 B2 * | 12/2018 | Li | F16M 13/02 |
| 2003/0059194 A1 * | 3/2003 | Trzecieski | G02B 6/4226 |
| | | | 385/137 |
| 2005/0006982 A1 * | 1/2005 | Williams | H02N 2/005 |
| | | | 310/311 |
| 2008/0265806 A1 * | 10/2008 | Tanaka | H02N 2/025 |
| | | | 318/116 |
| 2009/0127974 A1 * | 5/2009 | Piotr | H02N 2/025 |
| | | | 310/317 |

FOREIGN PATENT DOCUMENTS

| | | |
|---|---|---|
| JP | 2007-292057 A | 11/2007 |
| JP | 2013-108568 A | 6/2013 |
| JP | 2016-061412 A | 4/2016 |

* cited by examiner

PIEZOELECTRIC ACTUATOR, PIEZOELECTRIC VALVE, AND METHOD OF MANUFACTURING PIEZOELECTRIC ACTUATOR

CROSS REFERENCE TO RELATED APPLICATIONS

This application is a National Stage of International Application No. PCT/JP2020/009798, filed Mar. 6, 2020, and claims the benefit of Japanese Patent Application No. 2019-105449, filed Jun. 5, 2019, the entire contents of each of which are incorporated herein by reference.

TECHNICAL FIELD

The present disclosure relates to a piezoelectric actuator that operates a valve element utilizing displacement of a laminated piezoelectric element, a piezoelectric valve using the piezoelectric actuator, and a method of manufacturing a piezoelectric actuator.

BACKGROUND ART

Conventionally, a piezoelectric valve has been known that utilizes displacement of a laminated piezoelectric element to open and close the valve and discharge a compressed gas (see Patent Literature 1).

The piezoelectric valve described in Patent Literature 1 utilizes characteristics of a laminated piezoelectric element with excellent high-speed response performance, and includes a piezoelectric actuator that utilizes displacement of the laminated piezoelectric element to open and close the valve element.

The piezoelectric actuator has a displacement enlargement mechanism that enlarges a small displacement of the laminated piezoelectric element based on the principle of leverage. At an end part of the displacement enlargement mechanism, a pair of leaf springs are provided symmetrically with respect to the longitudinal axis of the laminated piezoelectric element, and a valve element is provided between the pair of leaf springs.

In the piezoelectric valve, when a voltage is applied to the laminated piezoelectric element, the displacement of the laminated piezoelectric element in the extension direction is transmitted to the valve element via the displacement enlargement mechanism, and the valve element is rapidly moved to open the valve.

Conversely, in the piezoelectric valve, when the voltage is not applied to the laminated piezoelectric element, the restoring force of the laminated piezoelectric element that accompanies the restoration to the original state is transmitted to the valve element via the displacement enlargement mechanism, so that the valve element is promptly brought into contact with the valve seat to close the valve.

Meanwhile, to improve the strength of the laminated piezoelectric element against the tensile force in the piezoelectric actuator, a tensile load is applied to the laminated piezoelectric element mounted on the displacement enlargement mechanism in advance in the extension direction (longitudinal direction) of the laminated piezoelectric element.

However, in the piezoelectric actuator, the tensile load distorts the displacement enlargement mechanism, which deforms the front surface of the valve element provided between the pair of leaf springs. This generates a risk of air leakage due to weakening of the pressing force and airtightness of the valve element against the valve seat surface when the piezoelectric valve is assembled.

As described in Patent Literature 1, it is possible to prevent air leakage when the valve is closed by pressing the valve element of the piezoelectric actuator against the valve seat surface with a compression margin when the piezoelectric valve is assembled. However, if the front surface of the valve element is deformed by tensile load, it is necessary to take a large compression margin. This makes the opening and closing operation of the valve element slow, and makes the movement amount of the valve element small. Therefore, the valve cannot open and close at high speed and with high accuracy, leading to a problem that deteriorates the performance of the piezoelectric valve.

CITATION LIST

Patent Literature

[Patent Literature 1] Japanese Patent Laid-Open No. 2013-108568

SUMMARY OF INVENTION

Technical Problem

It is an object of the present disclosure to provide a piezoelectric actuator that can reduce a risk of air leakage due to weakened pressing force against a valve seat surface of a valve element and airtightness, a piezoelectric valve using the piezoelectric actuator, and a method of manufacturing a piezoelectric actuator.

Solution to Problem

In order to achieve the above objectives, the present disclosure is
  a piezoelectric actuator used for a piezoelectric valve that opens and closes a valve utilizing displacement of a laminated piezoelectric element, the piezoelectric actuator comprising:
    a valve element;
    a laminated piezoelectric element that generates a driving force as a displacement, the driving force being required for operation of the valve element; and
    a displacement enlargement mechanism that enlarges the displacement of the laminated piezoelectric element and causes the enlarged displacement to act on the valve element,
  wherein a surface of the valve element to be in contact with a valve seat of the piezoelectric valve is made flat and smooth in a state in which a tensile load is applied to the laminated piezoelectric element.
  Preferably, the piezoelectric actuator of the present disclosure is such that
    the tensile load is applied to the laminated piezoelectric element in a direction of the valve element.
  Preferably, the piezoelectric actuator of the present disclosure is such that
    the displacement enlargement mechanism is arranged symmetrically with respect to a longitudinal axis of the laminated piezoelectric element, and a pair of leaf springs are provided at an end part of the displacement enlargement mechanism, symmetrically with respect to the longitudinal axis of the laminated piezoelectric element; and the valve element is provided between the pair of leaf springs.

Preferably, the piezoelectric actuator of the present disclosure is such that the displacement enlargement mechanism includes a displacement enlargement portion that enlarges a displacement of the laminated piezoelectric element and a displacement transmission portion that transmits the displacement of the laminated piezoelectric element;

the displacement transmission portion includes a U-shaped base board to which one end of the laminated piezoelectric element is joined and a cap member to which the other end of the laminated piezoelectric element is joined, the laminated piezoelectric element is installed between a U-shaped bottom portion of the base board and the cap member, and plastically deforming the U-shaped bottom portion of the base board applies the tensile load to the laminated piezoelectric element;

the displacement enlargement portion includes a pair of arms arranged symmetrically with respect to a straight line connecting the valve element and the longitudinal axis of the laminated piezoelectric element, each of the arms is integrated with an end of the base board and the cap member by a hinge, and the pair of leaf springs are provided at outer end parts of the arms, respectively; and the valve element is provided between the pair of leaf springs.

Preferably, the piezoelectric actuator of the present disclosure is such that a surface of the valve element to be in contact with the valve seat of the piezoelectric valve is subjected to a lubricating treatment.

In addition, in order to achieve the above objectives, this disclosure is a piezoelectric valve comprising:

a valve main part including a gas pressure chamber that receives compressed gas supplied from an outside; and a piezoelectric actuator, disposed inside the valve main part, including a valve element that opens and closes a gas discharge path for discharging compressed gas from the gas pressure chamber, a laminated piezoelectric element that generates a driving force as a displacement, and a displacement enlargement mechanism, the driving force being required for operation of the valve element, the displacement enlargement mechanism enlarging a displacement of the laminated piezoelectric element and causing the enlarged displacement to act on the valve element, wherein as the piezoelectric actuator, the piezoelectric actuator according to any one of the above is used.

Preferably, the piezoelectric valve of the present disclosure further comprises a plate to which a piezoelectric actuator according to any one of the above is fixed and which is disposed inside the valve main part together with the piezoelectric actuator, wherein the plate is provided with the gas discharge path and a valve seat with which the valve element of the piezoelectric actuator comes into contact, the piezoelectric actuator opening and closing the gas discharge path.

Furthermore, in order to achieve the above objectives, the present disclosure is a method of manufacturing a piezoelectric actuator used for a piezoelectric valve that opens and closes a valve utilizing displacement of a laminated piezoelectric element, the piezoelectric actuator including: a valve element; a laminated piezoelectric element that generates a driving force as a displacement, and a displacement enlargement mechanism, the driving force being required for operation of the valve element, the displacement enlargement mechanism enlarging the displacement of the laminated piezoelectric element and causing the enlarged displacement to act on the valve element, the method comprising making a surface of the valve element flat and smooth in a state in which a tensile load is applied to the laminated piezoelectric element, the valve element being in contact with a valve seat of the piezoelectric valve.

Preferably, the method of manufacturing the piezoelectric actuator of the present disclosure is such that the displacement enlargement mechanism is arranged symmetrically with respect to a longitudinal axis of the laminated piezoelectric element, and a pair of leaf springs are provided at an end part of the displacement enlargement mechanism, symmetrically with respect to the longitudinal axis of the laminated piezoelectric element;

the valve element is provided between the pair of leaf springs; and the surface of the valve element is made flat and smooth by polishing in a state in which a tensile load is applied to the laminated piezoelectric element.

Preferably, the method of manufacturing the piezoelectric actuator of the present disclosure is such that the displacement enlargement mechanism is arranged symmetrically with respect to a longitudinal axis of the laminated piezoelectric element, and a pair of leaf springs formed from one member are provided at an end part of the displacement enlargement mechanism, symmetrically with respect to the longitudinal axis of the laminated piezoelectric element, the pair of leaf springs having an installation portion of the valve element provided in a central part; and the surface of the valve element is made flat and smooth by providing a valve element to be integrally formed with the installation portion between the pair of leaf springs, in a state in which a tensile load is applied to the laminated piezoelectric element.

Advantageous Effects of Invention

The piezoelectric actuator of the present disclosure has the valve element to be in contact with the valve seat of the piezoelectric valve. The surface of the valve element is made flat and smooth in a state in which a tensile load is applied to the laminated piezoelectric element. Therefore, when the piezoelectric valve is assembled, it is possible to reduce a risk of air leakage due to the weakening of the pressing force of the valve element against the valve seat surface and airtightness.

In addition, the piezoelectric actuator of the present disclosure does not need to take a large compression margin in assembling the piezoelectric valve even when the valve element is pressed against the valve seat surface with a compression margin to prevent air leakage at a time of closing the valve. Thus, it is possible to open and close the valve at high speed and with high accuracy.

In the piezoelectric actuator of the present disclosure, if the surface of the valve element to be in contact with the valve seat of the piezoelectric valve is subjected to a lubricating treatment, the surface of the valve element can have highly non-adhesive and lubricating properties. Therefore, when the piezoelectric valve is not operated for a long time after the piezoelectric valve is assembled, it is possible to prevent the valve element from adhering to the valve seat surface and becoming difficult to separate, resulting in malfunction.

In the piezoelectric valve of the present disclosure, a piezoelectric actuator having a valve element to be in contact with the valve seat is used. The surface of the valve element is made flat and smooth in a state in which a tensile load is applied to the laminated piezoelectric element. Thus, it is possible to reduce the risk of air leakage due to the weakening of the pressing force of the valve element against the valve seat surface and airtightness.

In addition, the piezoelectric valve of the present disclosure does not need to take a large compression margin in assembling the piezoelectric valve even when the valve element is pressed against the valve seat surface with a compression margin to prevent air leakage at a time of closing the valve. Thus, it is possible to open and close the valve at high speed and with high accuracy.

The method of manufacturing a piezoelectric actuator of the present disclosure is such that the surface of the valve element to be in contact with the valve seat of the piezoelectric valve is made flat and smooth, in a state in which a tensile load is applied to the laminated piezoelectric element. Therefore, it is possible to manufacture a piezoelectric actuator capable of reducing the risk of air leakage due to weakening of the pressing force of the valve element against the valve seat surface and airtightness.

In addition, the method of manufacturing a piezoelectric actuator of the present disclosure is such that the surface of the valve element to be in contact with the valve seat of the piezoelectric valve is made flat and smooth, in a state in which a tensile load is applied to the laminated piezoelectric element. Therefore, the method does not need to take a large compression margin in assembling the piezoelectric valve even when the valve element is pressed against the valve seat surface with a compression margin to prevent air leakage at a time of closing the valve, and can manufacture a piezoelectric actuator that can open and close a valve at high speed and with high accuracy.

DESCRIPTION OF EMBODIMENTS

Embodiments of the present disclosure will be described with reference to the drawings.

Figure 1:
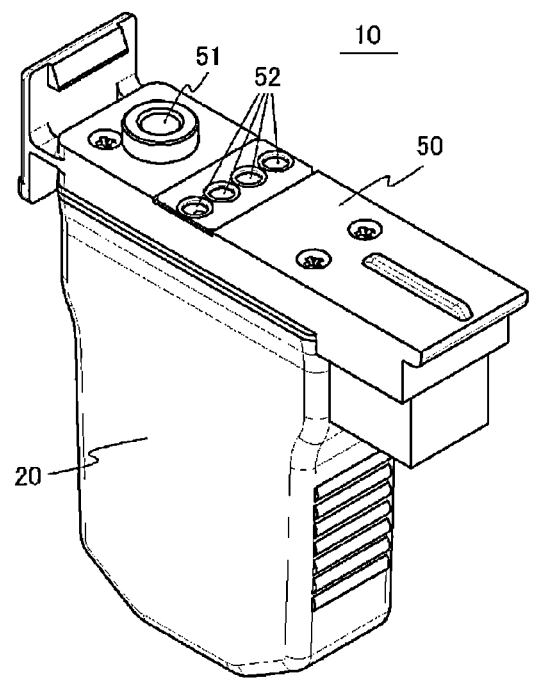
FIG. 1 is a perspective view of a piezoelectric valve.
Figure 2:
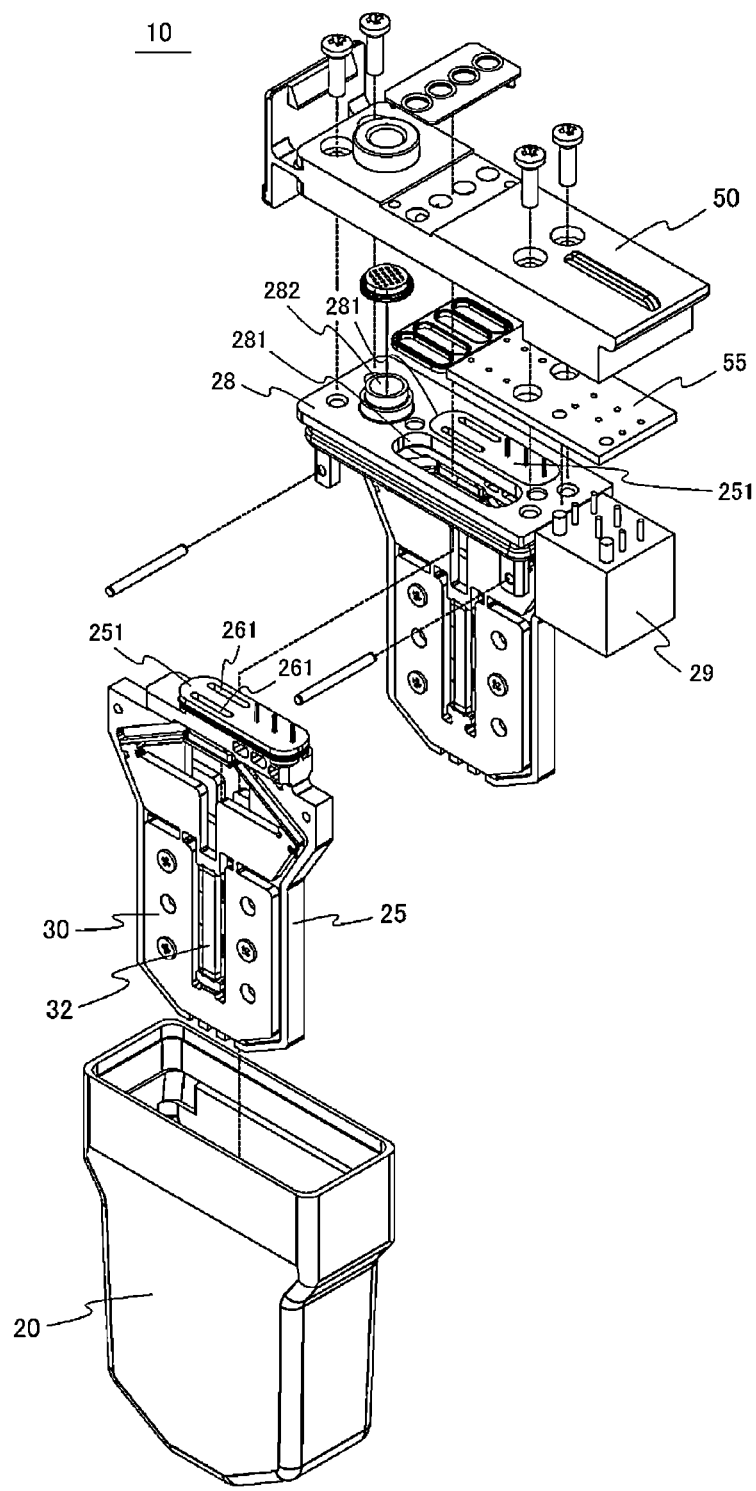
FIG. 2 is an exploded perspective view of a piezoelectric valve.
Figure 3:
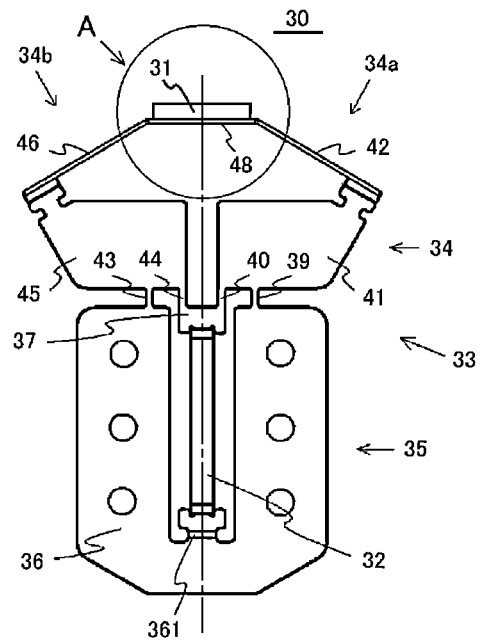
FIG. 3 is an explanatory diagram of a piezoelectric actuator used in a piezoelectric valve.
Figure 4:
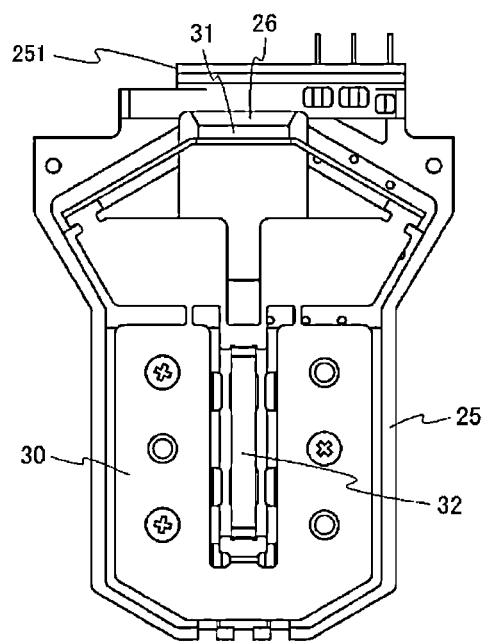
FIG. 4 is an explanatory diagram of a state in which a piezoelectric actuator is fixed to a valve seat plate used for a piezoelectric valve.
Figure 5:
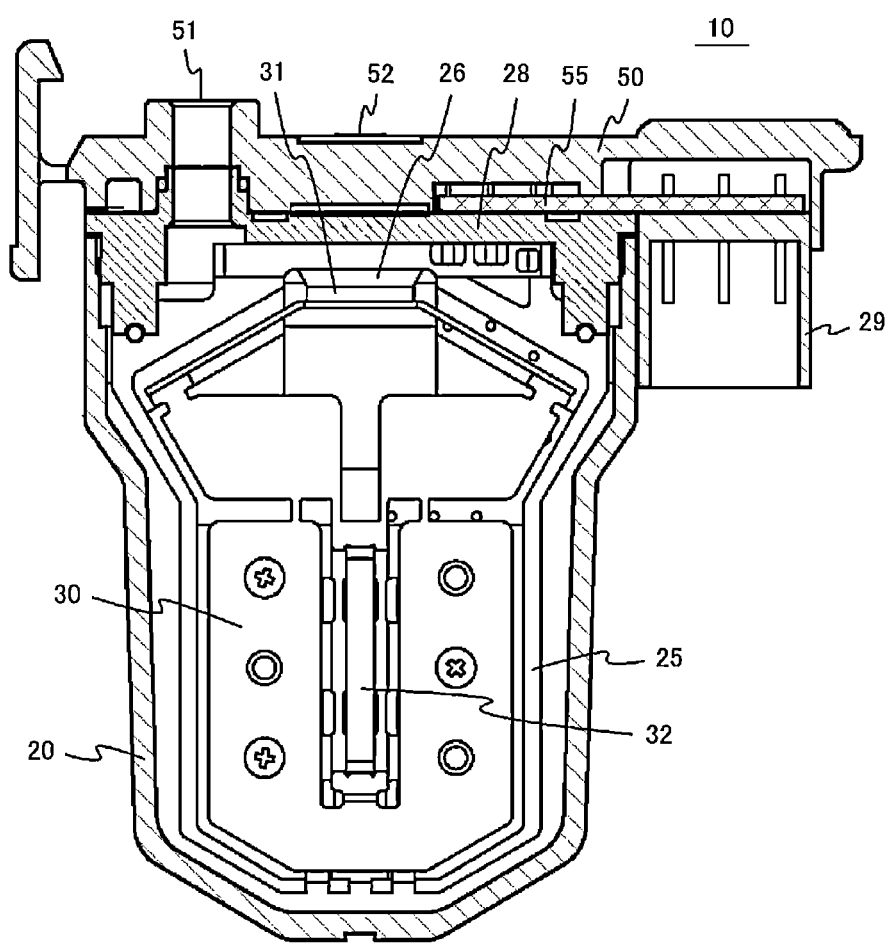
FIG. 5 is a cross-sectional view of a piezoelectric valve, and is an explanatory diagram of a state in which a valve seat plate is disposed inside a valve main part.

FIG. 1 is a perspective view of an example of a piezoelectric valve. FIG. 2 is an exploded perspective view of the piezoelectric valve of FIG. 1. FIG. 3 is an explanatory diagram of a piezoelectric actuator used for the piezoelectric valve of FIG. 1. FIG. 4 is an explanatory diagram of a state in which the piezoelectric actuator is fixed to a valve seat plate used for the piezoelectric valve of FIG. 1. FIG. 5 is a cross-sectional view of the piezoelectric valve of FIG. 1 and an explanatory diagram of a state in which the valve seat plate is disposed inside the valve main part.

The piezoelectric valve 10 shown in FIGS. 1 to 5 includes a valve main part 20, a valve seat plate 25 disposed inside the valve main part 20 and fixed to the valve main part 20, and a piezoelectric actuator 30 fixed to both sides of the valve seat plate 25 with screws.

The valve main part 20 is a case whose front surface is open, and includes a gas pressure chamber inside that receives supply of compressed gas from an external compressed gas supply source (not shown).

Furthermore, a connector portion 50 is provided on the front surface of the valve main part 20. A gas suction port 51 for sucking compressed gas into the valve main part 20 and a gas discharge port 52 for discharging compressed gas are opened on the front surface of the connector portion 50.

A wiring board 55 for supplying power to a laminated piezoelectric element 32 (hereinafter referred to as "piezoelectric element") is disposed between the valve main part 20 and the connector portion 50. A wiring connector 29 for supplying power to the piezoelectric element 32 via the wiring board 55 is disposed at one side end of the connector portion 50 and at a lateral position of the valve main part 20.

The valve seat plate 25 is provided with attachment part for the piezoelectric actuator 30 on both sides, and has a valve seat 26 with which a valve element 31 to be described below of the piezoelectric actuator 30 is in contact. Furthermore, in a front protruding portion 251 of the valve seat plate 25, gas discharge paths 261 is formed through which the valve seat surface of the valve seat 26 is in communication with the gas discharge port 52 of the connector portion 50.

A lid member 28 that closes the opening of the valve main part 20 is attached to the front surface of the valve seat plate 25. The lid member 28 is formed with an opening 281 into which the front protruding portion 251 of the valve seat plate 25 fits. The lid member 28 is formed with a gas suction path 282 through which the gas suction port 51 that opens on the front surface of the connector portion 50 is in communication with the inside of the valve main part 20.

The valve seat plate 25 is molded from, for example, a synthetic resin material, and the wiring from the wiring board 55 to the piezoelectric element 32 is molded.

At the rear position of the valve seat plate 25, there is exposed electrodes of the wiring connected to lead wires of the piezoelectric element 32 (not shown).

As shown in FIG. 3, the piezoelectric actuator 30 includes the valve element 31, a piezoelectric element 32 that generates a driving force required for operation of the valve element 31 as a displacement, and a displacement enlargement mechanism 33 that enlarges the displacement of the piezoelectric element 32 and causes it to act on the valve element 31.

For the piezoelectric element 32, for example, a resin-coated-type piezoelectric element can be used. The resin-coated-type piezoelectric element is thinly coated with epoxy resin over the entire peripheral surface including the side surface where the internal electrode layer is exposed.

For the valve element 31, for example, nitrile rubber (NBR) or fluorine rubber (FKM, FEPM, FFKM) can be used. The nitrile rubber and fluorine rubber used for the valve element 31 are preferably those having a hardness of, for example, 80±10.

The valve element 31 can be subjected to a lubricating treatment such as a halogenation treatment at least on the surface to be in contact with the valve seat surface of the valve seat 26.

If the piezoelectric valve 10 is not operated for a long time, the rubber valve element 31 may adhere to the valve seat surface of the resin valve seat 26 and be difficult to separate, which may cause malfunction. However, if at least the surface of the valve element 31 to be in contact with the valve seat is subjected to a lubricating treatment so that it has highly non-adhesive and lubricating properties, it would be possible to prevent malfunction.

The displacement enlargement mechanism 33 has a displacement enlargement portion 34 that enlarges the displacement of the piezoelectric element 32 and a displacement transmission portion 35 that transmits the displacement of the piezoelectric element 32 to the displacement enlargement portion 34. The displacement enlargement portion 34 and the piezoelectric element 3 are respectively arranged symmetrically with respect to the axis in the operating direction of the valve element 31, here, the straight line connecting the valve element 31 and the longitudinal axis of the piezoelectric element 32.

The displacement transmission portion 35 has a U-shaped base board 36 to which one end of the piezoelectric element 32 is joined, and a cap member 37 to which the other end of the piezoelectric element 32 is joined. The piezoelectric element 32 is disposed in the space of the U-shaped base board 36, so that the displacement enlargement mechanism 33 is arranged symmetrically with respect to the longitudinal axis of the piezoelectric element 32.

Here, the piezoelectric element 32 is installed in the space of the U-shaped base board 36 between the U-shaped bottom portion 361 of the base board 36 and the cap member 37, for example, via an adhesive. One end of the piezoelectric element 32 is joined to the U-shaped bottom portion 361 of the base board 36 and the other end is joined to the cap member 37, by plastically deforming the U-shaped bottom portion 361 of the base board 36. A tensile load is applied to the piezoelectric element 32 in the direction of the valve element 31 (the direction of pressing against the valve element 31) by plastically deforming the U-shaped bottom portion 361 of the base board 36.

The displacement enlargement portion 34 is configured of a first and second displacement enlargement portions 34a and 34b arranged symmetrically with respect to a straight line connecting the valve element 31 and the longitudinal axis of the piezoelectric element 32.

The first displacement enlargement portion 34a has a first and second hinges 39 and 40, a first arm 41, and a first leaf spring 42. The first arm 41 is integrated with one side end of the U-shaped base board 36 by a first hinge 39. The first arm 41 is integrated with the cap member 37 by the second hinge 40. One end of the first leaf spring 42 is joined to the outer end part of the first arm 41.

On the other hand, the second displacement enlargement portion 34b has a third and fourth hinges 43 and 44, a second arm 45, and a second leaf spring 46. The second arm 45 is integrated with the other side end of the U-shaped base board 36 by the third hinge 43. The second arm 45 is integrated with the cap member 37 by the fourth hinge 44. One end of the second leaf spring 46 is joined to the outer end part of the second arm 45.

Here, the displacement enlargement mechanism 33 can be integrally formed by punching out a metal material such as a stainless steel material including an invar material, except for the first and second leaf springs 42 and 46, for example.

The first leaf spring 42 and the second leaf spring 46 can be formed from, for example, one sheet of metal plate material. Here, the first leaf spring 42 and the second leaf spring 46 are respectively formed on opposite parts of one sheet of single metal plate material, which is symmetrical with respect to the longitudinal axis of the piezoelectric element 32 and is formed into a shape having an installation portion 48 of the valve element 31 in the central part. The installation portion 48 is, for example, a portion including a flat installation surface orthogonal to the longitudinal axis of the piezoelectric element 32. One ends of the first and second leaf springs 42 and 46 are joined to the outer end parts of the first and second arms 41 and 45, respectively. The valve element 31 is provided on the installation portion 48 located between the other ends of the first and second leaf springs 42 and 46 and on the longitudinal axis of the piezoelectric element 32.

When the piezoelectric element 32 is energized in the valve closed state of the piezoelectric actuator 30, the piezoelectric element 32 extends. In the displacement enlargement mechanism 33, the displacement of the piezoelectric element 32 due to the extension is enlarged by the principle of leverage with the first and third hinges 39 and 43 serving as fulcrums, the second and fourth hinges 40 and 44 serving as efforts, and the outer end parts of the first and second arms 41 and 45 serving as loads, and this largely displaces the outer end parts of the first and second arms 41 and 45.

Then, the displacement of the outer end parts of the first and second arms 41 and 45 separates the valve element 31 from the valve seat 26 via the first and second leaf springs 42 and 46, and opens the gas discharge path 261.

Conversely, the above piezoelectric actuator 30 works such that: when the piezoelectric element 32 is not energized, the piezoelectric element 32 contracts; the contraction causes the valve element 31 to be seated on the valve seat 26 via the displacement enlargement mechanism 33; and this closes the gas discharge path 261.

Note that it is also possible to: form the first leaf spring 42 and the second leaf spring 46 using separate members; and join one lateral end part of the valve element 31 to the other end of the first leaf spring 42 and join the other lateral end part of the valve element 31 to the other end of the second leaf spring 46 to provide the valve element 31 between the other ends of the first and second leaf springs 42 and 46.

Figure 6:
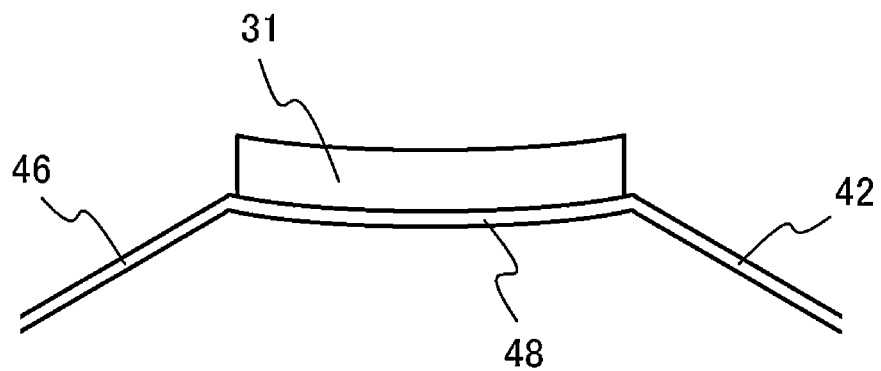
FIG. 6 is an enlarged view of part A of FIG. 3, and is an explanatory diagram of a piezoelectric actuator in a state in which a tensile load is applied to a laminated piezoelectric element.
Figure 7:
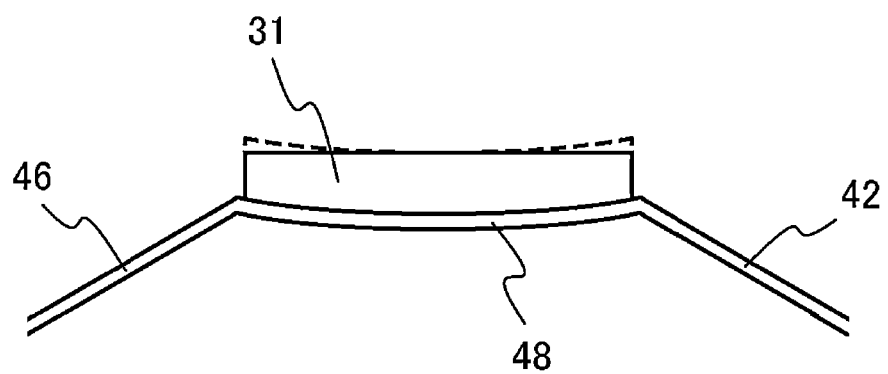
FIG. 7 is an explanatory diagram of a state in which a surface of a valve element is made flat and smooth in the piezoelectric actuator of FIG. 6.

FIG. 6 is an enlarged view of part A of FIG. 3, and is an explanatory diagram of the piezoelectric actuator in a state in which a tensile load is applied to the laminated piezoelectric element. FIG. 7 is an explanatory diagram of the piezoelectric actuator of FIG. 6 in which the surface of the valve element is made flat and smooth in a state in which a tensile load is applied to the laminated piezoelectric element.

In the piezoelectric actuator 30, the U-shaped bottom portion 361 of the base board 36 is plastically deformed, so that a tensile load is applied to the piezoelectric element 32 in the direction of the valve element 31. Therefore, the displacement enlargement mechanism 33 is distorted, and, for example, the front surface of the valve element 31 provided in the installation portion 48 between the other ends of the first leaf spring 42 and the second leaf spring 46 is deformed in a concave shape, as shown in FIG. 6. This makes a risk in which air leakage occurs due to weakening of the pressing force of the valve element 31 against the valve seat surface and airtightness when the piezoelectric valve is assembled.

Then, in the embodiments of the present disclosure, the front surface of the valve element 31 in the piezoelectric actuator 30 is made flat and smooth so as to be orthogonal to the longitudinal axis of the piezoelectric element 32, that is, the axis of the valve element 31 in the operating direction in a state in which a tensile load is applied to the piezoelectric element 32.

For example, in the embodiment of the present disclosure, as shown in FIG. 7, the piezoelectric actuator 30 can have the front surface of the concavely deformed valve element 31 made flat and smooth by polishing.

Alternatively, in the embodiments of the present disclosure, the piezoelectric actuator 30 can have the valve element 31 provided so as to be integrally formed with the installation portion 48 provided in the central part between the other ends of the first and second leaf springs 42 and 46, in a state in which a tensile load is applied to the piezoelectric element 32. In this way, the front surface of the valve element 31 can be made flat and smooth.

In the piezoelectric actuator in the embodiment of the present disclosure, the surface of the valve element 31 to be in contact with the valve seat 26 of the piezoelectric valve 10 is made flat and smooth in a state in which a tensile load is applied to the piezoelectric element 32. Therefore, when the piezoelectric actuator is assembled to the piezoelectric valve 10, it is possible to reduce the risk of air leakage due to weakening of the pressing force of the valve element 31 against the valve seat surface and airtightness.

In the piezoelectric actuator in the embodiment of the present disclosure, the valve element can also be pressed against the valve seat surface with a compression margin to assemble the piezoelectric valve, as described in Patent Literature 1.

The piezoelectric actuator in the embodiment of the present disclosure does not need to take a large compression margin in assembling the piezoelectric valve even when the valve element is pressed against the valve seat surface with a compression margin to prevent air leakage at a time of closing the valve. Thus, it is possible to open and close the valve at high speed and with high accuracy.

The embodiments of the present disclosure are described above, but it goes without saying that the present disclosure is not limited to the above embodiments, and the configuration thereof can be appropriately changed as long as it does not deviate from the scope of the disclosure.

INDUSTRIAL APPLICABILITY

The piezoelectric actuator of the present disclosure can be used for a piezoelectric valve that opens and closes a valve by utilizing the displacement of a laminated piezoelectric element.

REFERENCE SIGNS LIST 10 piezoelectric valve
20 valve main part
25 valve seat plate
251 front protruding portion
26 valve seat
261 gas discharge path
28 lid member
281 opening
282 gas suction path
29 wiring connector
30 piezoelectric actuator
31 valve element
32 laminated piezoelectric element
33 displacement enlargement mechanism
34 displacement enlargement portion
35 displacement transmission portion
36 base board
361 U-shaped bottom portion
37 cap member
39 first hinge
40 second hinge
41 first arm
42 first leaf spring
43 third hinge
44 fourth hinge
45 second arm
46 second leaf spring
48 installation portion
50 connector portion
51 gas suction port
52 gas discharge port
55 wiring board

The invention claimed is:

1. A piezoelectric actuator used for a piezoelectric valve that opens and closes a valve utilizing displacement of a laminated piezoelectric element, the piezoelectric actuator comprising:
  a valve element;
  a laminated piezoelectric element that generates a driving force as a displacement, the driving force being required for operation of the valve element; and
  a displacement enlargement mechanism that enlarges the displacement of the laminated piezoelectric element and causes the enlarged displacement to act on the valve element,
  wherein a surface of the valve element to be in contact with a valve seat of the piezoelectric valve is made flat and smooth in a state by polishing in which a tensile load is applied to the laminated piezoelectric element with a front surface of the valve element being deformed in a concave shape.

2. The piezoelectric actuator according to claim 1, wherein the tensile load is applied to the laminated piezoelectric element in a direction of the valve element.

3. The piezoelectric actuator according to claim 2, wherein:
  the displacement enlargement mechanism is arranged symmetrically with respect to a longitudinal axis of the laminated piezoelectric element, and a pair of leaf springs are provided at an end part of the displacement enlargement mechanism, symmetrically with respect to the longitudinal axis of the laminated piezoelectric element; and the valve element is provided between the pair of leaf springs.

4. The piezoelectric actuator according to claim 3, wherein:

the displacement enlargement mechanism includes a displacement enlargement portion that enlarges a displacement of the laminated piezoelectric element and a displacement transmission portion that transmits a displacement of the laminated piezoelectric element;

the displacement transmission portion includes a U-shaped base board to which one end of the laminated piezoelectric element is joined and a cap member to which the other end of the laminated piezoelectric element is joined, the laminated piezoelectric element is installed between a U-shaped bottom portion of the base board and the cap member, and plastically deforming the U-shaped bottom portion of the base board applies the tensile load to the laminated piezoelectric element;

the displacement enlargement portion includes a pair of arms arranged symmetrically with respect to a straight line connecting the valve element and the longitudinal axis of the laminated piezoelectric element, each of the arms is integrated with an end of the base board and the cap member by a hinge, and the pair of leaf springs are provided at outer end parts of the arms, respectively; and the valve element is provided between the pair of leaf springs.

5. The piezoelectric actuator according to claim 1, wherein the surface of the valve element to be in contact with the valve seat of the piezoelectric valve is subjected to a lubricating treatment.

6. A piezoelectric valve comprising:

a valve main part including a gas pressure chamber that receives compressed gas supplied from an outside; and the piezoelectric actuator according to claim 1, disposed inside the valve main part, including the valve element that opens and closes a gas discharge path for discharging compressed gas from the gas pressure chamber, the laminated piezoelectric element that generates the driving force as the displacement, and the displacement enlargement mechanism, the driving force being required for operation of the valve element, the displacement enlargement mechanism enlarging the displacement of the laminated piezoelectric element and causing the enlarged displacement to act on the valve element.

7. The piezoelectric valve according to claim 6, further comprising a plate to which the piezoelectric actuator is fixed and which is disposed inside the valve main part together with the piezoelectric actuator, wherein the plate is provided with the gas discharge path and a valve seat with which the valve element of the piezoelectric actuator comes into contact, the piezoelectric actuator opening and closing the gas discharge path.

8. A method of manufacturing a piezoelectric actuator used for a piezoelectric valve that opens and closes a valve utilizing displacement of a laminated piezoelectric element, the piezoelectric actuator including: a valve element; a laminated piezoelectric element that generates a driving force as a displacement, and a displacement enlargement mechanism, the driving force being required for operation of the valve element, the displacement enlargement mechanism enlarging the displacement of the laminated piezoelectric element and causing the enlarged displacement to act on the valve element, the method comprising:

making a surface of the valve element flat and smooth in a state by polishing in which a tensile load is applied to the laminated piezoelectric element, the surface of the valve element with a front surface of the valve element being deformed in a concave shape.

9. The method of manufacturing the piezoelectric actuator according to claim 8, wherein:

the displacement enlargement mechanism is arranged symmetrically with respect to a longitudinal axis of the laminated piezoelectric element, and a pair of leaf springs are provided at an end part of the displacement enlargement mechanism, symmetrically with respect to the longitudinal axis of the laminated piezoelectric element, the valve element is provided between the pair of leaf springs; and the surface of the valve element is made flat and smooth by polishing in a state in which a tensile load is applied to the laminated piezoelectric element.

10. The method of manufacturing the piezoelectric actuator according to claim 8, wherein:

the displacement enlargement mechanism is arranged symmetrically with respect to a longitudinal axis of the laminated piezoelectric element, and a pair of leaf springs formed from one member are provided at an end part of the displacement enlargement mechanism, symmetrically with respect to the longitudinal axis of the laminated piezoelectric element, the pair of leaf springs having an installation portion of the valve element provided in a central part; and the surface of the valve element is made flat and smooth by providing the valve element to be integrally formed with the installation portion between the pair of leaf springs, in a state in which a tensile load is applied to the laminated piezoelectric element.

* * * * *